(12) United States Patent
Negishi

(10) Patent No.: US 7,475,310 B2
(45) Date of Patent: Jan. 6, 2009

(54) SIGNAL OUTPUT CIRCUIT, AND TEST APPARATUS

(75) Inventor: Toshiyuki Negishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 359 days.

(21) Appl. No.: 11/501,397

(22) Filed: Aug. 9, 2006

(65) Prior Publication Data

US 2008/0052580 A1      Feb. 28, 2008

(51) Int. Cl.
*G01R 31/28* (2006.01)
(52) U.S. Cl. .................... 714/731; 714/744; 327/146; 327/261
(58) Field of Classification Search .............. 375/226; 708/819; 327/146, 261, 278, 158; 702/125; 714/731, 744
See application file for complete search history.

(56) References Cited

U.S. PATENT DOCUMENTS

| | | | | |
|---|---|---|---|---|
| 4,887,279 | A * | 12/1989 | Odenheimer | 375/226 |
| 5,210,712 | A * | 5/1993 | Saito | 708/819 |
| 5,974,891 | A * | 11/1999 | Uchikawa et al. | 73/625 |
| 6,265,918 | B1 * | 7/2001 | Toda | 327/146 |
| 6,940,330 | B2 * | 9/2005 | Okayasu | 327/261 |
| 7,283,920 | B2 * | 10/2007 | Doi et al. | 702/125 |
| 7,304,521 | B2 * | 12/2007 | Carley et al. | 327/278 |
| 2006/0176091 | A1 * | 8/2006 | Sakiyama et al. | 327/158 |

* cited by examiner

*Primary Examiner*—David Ton
(74) *Attorney, Agent, or Firm*—Osha•Liang LLP

(57) ABSTRACT

A signal output circuit for outputting an output signal in accordance with a predetermined system timing is provided. The signal output circuit includes a shift register that delays an input signal in accordance with the system timing, a flip-flop that receives the input signal delayed by the shift register in response to a clock signal supplied thereto, and outputs the input signal as the output signal, and an initializing section that measures a delay amount achieved by the shift register and judges whether the measured delay amount is in accordance with the system timing. The initializing section includes an input section that inputs a reference signal into the shift register, a counting section that counts the number of pulses of the clock signal by using the reference signal as a trigger, and causes inputting of the clock signal into the flip-flop to be suspended when a value indicating a result of the counting reaches a value set in accordance with the system timing, a measuring section that measures a signal output from the flip-flop, and a judging section that judges whether the signal measured by the measuring section corresponds to the reference signal.

4 Claims, 3 Drawing Sheets

SIGNAL OUTPUT CIRCUIT, AND TEST APPARATUS

BACKGROUND

1. Field of the Invention

The present invention relates to a signal output circuit for outputting a signal, and a test apparatus including a signal output circuit. The present invention particularly relates to a signal output circuit for outputting a signal in accordance with a predetermined system timing.

2. Related Art

A typical test apparatus for testing a device under test (DUT) such as a semiconductor circuit includes a signal output circuit for inputting a predetermined signal into the DUT and a judging section for judging whether the DUT is good or bad based on an output signal from the DUT.

FIG. 3 shows a configuration of a typical signal output circuit 300. The signal output circuit 300 includes a pattern generating section 310 and a timing generating section 320. The pattern generating section 310 outputs a data signal in response to a clock signal supplied thereto. The timing generating section 320 outputs the data signal output from the pattern generating section 310 in response to a clock signal supplied thereto, in place of the clock signal supplied to the pattern generating section 310.

The pattern generating section 310 includes a delay element 312 and a plurality of flip-flops 314 in a cascade arrangement. The data signal is sequentially propagated among the flip-flops 314 in response to the clock signal supplied to the flip-flops 314 via the delay element 312. Having the above configuration, the pattern generating section 310 inputs the data signal into the timing generating section 320 at a timing determined by the number of stages of the flip-flops 314.

The timing generating section 320 includes a FIFO 322, a write counter 324, a selecting section 326, a read counter 328, a flip-flop 330 and a logical AND circuit 332. The FIFO 322 sequentially receives the data signal output from the pattern generating section 310 in response to the clock signal supplied to the pattern generating section 310. The flip-flop 330 receives data which is sequentially read from the FIFO 322 in response to a clock signal supplied to the timing generating section 320, and outputs the data.

The write counter 324 controls a valid entry in the FIFO 322 into which next data is to be written, and the read counter 328 and selecting section 326 control a valid entry in the FIFO 322 from which data is to be read. The write counter 324 and read counter 328 vary their values each time the counters 324 and 328 write/read data into/from the FIFO 322, so as to keep track of valid entries in the FIFO 322. The logical AND circuit 332 outputs a logical AND between the output of the flip-flop 330 and the clock signal.

With the above configuration, the timing generating section 320 can output a predetermined data signal in response to the clock signal supplied thereto in place of the clock signal supplied to the pattern generating section 310, without causing meta-stable in the flip-flop 330.

In recent years, test apparatuses with a plurality of signal output circuits have been developed. Such a test apparatus can perform a desired test by using a combination of selected signal output circuits. In this type of test apparatus, it is necessary to synchronize the timings at which the signal output circuits output the signals. In other words, the signal output circuits are required to output the signals in accordance with a predetermined system timing.

However, the typical signal output circuit 300 has difficulties in adjusting the timing of outputting the signal. It is possible to adjust this signal output timing at the pattern generating section 310, by selecting a different one of the flip-flops 314 from which the signal is to be output to the timing generating section 320. When the timing at which the pattern generating section 310 outputs the signal is adjusted in the above manner, however, the timing adjustment only has a limited effect because of the FIFO 322, which is provided to prevent meta-stable.

The typical signal output circuit 300 has a different problem. It is difficult to examine whether the signal output circuit 300 operates in accordance with a predetermined system timing.

SUMMARY

An advantage of some aspects of the present invention is to provide a signal output circuit and a test apparatus which can solve the above-mentioned problems. This is achieved by combining the features recited in the independent claims. The dependent claims define further effective specific example of the present invention.

A first aspect of the invention provides a signal output circuit for outputting an output signal in accordance with a predetermined system timing. The signal output circuit includes a shift register that receives an input signal and delays the input signal in accordance with the system timing, a flip-flop that receives the input signal delayed by the shift register in response to a clock signal supplied thereto, and outputs the input signal as the output signal, and an initializing section that measures a delay amount achieved by the shift register and judges whether the measured delay amount is in accordance with the system timing. The initializing section includes an input section that inputs a reference signal into the shift register, a counting section that counts the number of pulses of the clock signal by using the reference signal as a trigger, and causes inputting of the clock signal into the flip-flop to be suspended when a value indicating a result of the counting reaches a value set in accordance with the system timing, a measuring section that measures a signal output from the flip-flop in a case where the inputting of the clock signal is suspended, and a judging section that judges whether the signal measured by the measuring section corresponds to the reference signal.

The signal output circuit may further include a skew adjuster that delays the input signal output from the shift register and inputs the delayed input signal into the flip-flop. Here, the initializing section may adjust a delay amount achieved by the skew adjuster based on the judgment made by the judging section.

Here, each time the system timing is varied, the initializing section may measure the delay amount achieved by the shift register, judge whether the measured delay amount is in accordance with the system timing, and adjust the delay amount achieved by the skew adjuster.

A second aspect of the invention provides a test apparatus for testing a device under test. The test apparatus includes a signal output circuit that supplies a predetermined signal to the device in accordance with a predetermined system timing, and a quality judging section that judges whether the device is good or bad based on a signal output from the device. The signal output circuit includes a shift register that receives an input signal and delays the input signal in accordance with the system timing, a flip-flop that receives the input signal delayed by the shift register in response to a clock signal supplied thereto, and outputs the input signal as the predetermined signal, and an initializing section that measures a delay amount achieved by the shift register and judges whether the measured delay amount is in accordance with the system timing. The initializing section includes an input section that inputs a reference signal into the shift register, a counting section that counts the number of pulses of the clock signal by using the reference signal as a trigger, and causes inputting of the clock signal into the flip-flop to be suspended when a value indicating a result of the counting reaches a value set in accordance with the system timing, a measuring section that measures a signal output from the flip-flop in a case where the inputting of the clock signal is suspended, and a judging section that judges whether the signal measured by the measuring section corresponds to the reference signal.

Here, all the necessary features of aspects of the present invention are not listed in the summary of the invention. The sub-combinations of the features may become the invention.

DESCRIPTION OF EXEMPLARY EMBODIMENT

Hereinafter, an embodiment of the present invention will now be described. The embodiment does not limit the invention according to the claims, and all the combinations of the features described in the embodiment are not necessarily essential to the means provided by aspects of the invention.

Figure 1:
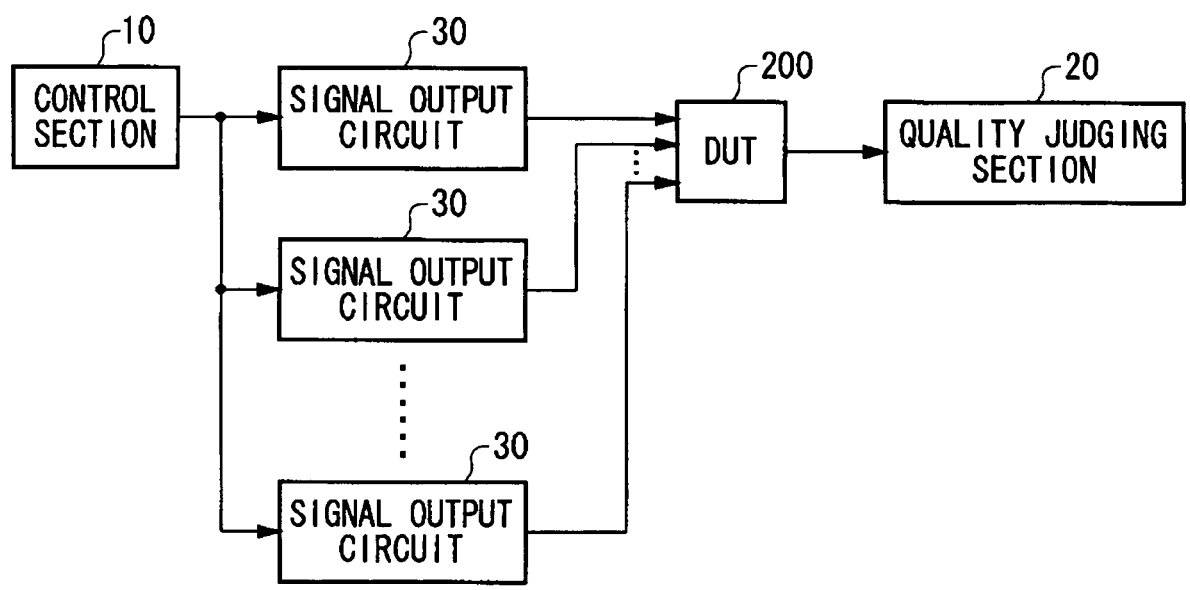
FIG. 1 shows an exemplary configuration of a test apparatus 100 according to an embodiment of the invention.

FIG. 1 shows an exemplary configuration of a test apparatus 100 according to an embodiment of the invention. The test apparatus 100 tests a device under test (DUT) 200 which is a semiconductor circuit, for example. The test apparatus 100 includes a control section 10, a plurality of signal output circuits 30, and a quality judging section 20.

Each of the signal output circuits 30 inputs a signal into the DUT 200 in accordance with a predetermined system timing. Each of the signal output circuits 30 may generate a pattern signal, a clock signal, a control signal and the like, and input these signals into the DUT 200.

The control section 10 controls each of the signal output circuits 30. For example, the control section 10 may input a clock signal, a trigger signal and the like into each of the signal output circuits 30, in order to cause the signal output circuits 30 to operate.

Here, each of the signal output circuits 30 is provided in a removable manner in the test apparatus 100. Thus, the test apparatus 100 can use a combination of selected signal output circuits 30.

When a new combination of signal output circuits 30 is provided, the control section 10 may assign a new system timing to each of the signal output circuits 30. The control section 10 may determine the system timing based on one of the signal output circuits 30 which requires the longest time period from trigger signal reception to signal output, for example.

The quality judging section 20 judges whether the DUT 200 is good or bad based on the signal output from the DUT 200. For example, the quality judging section 20 may make such judgment by comparing the signal output from the DUT 200 with an expected value signal supplied thereto.

Figure 2:
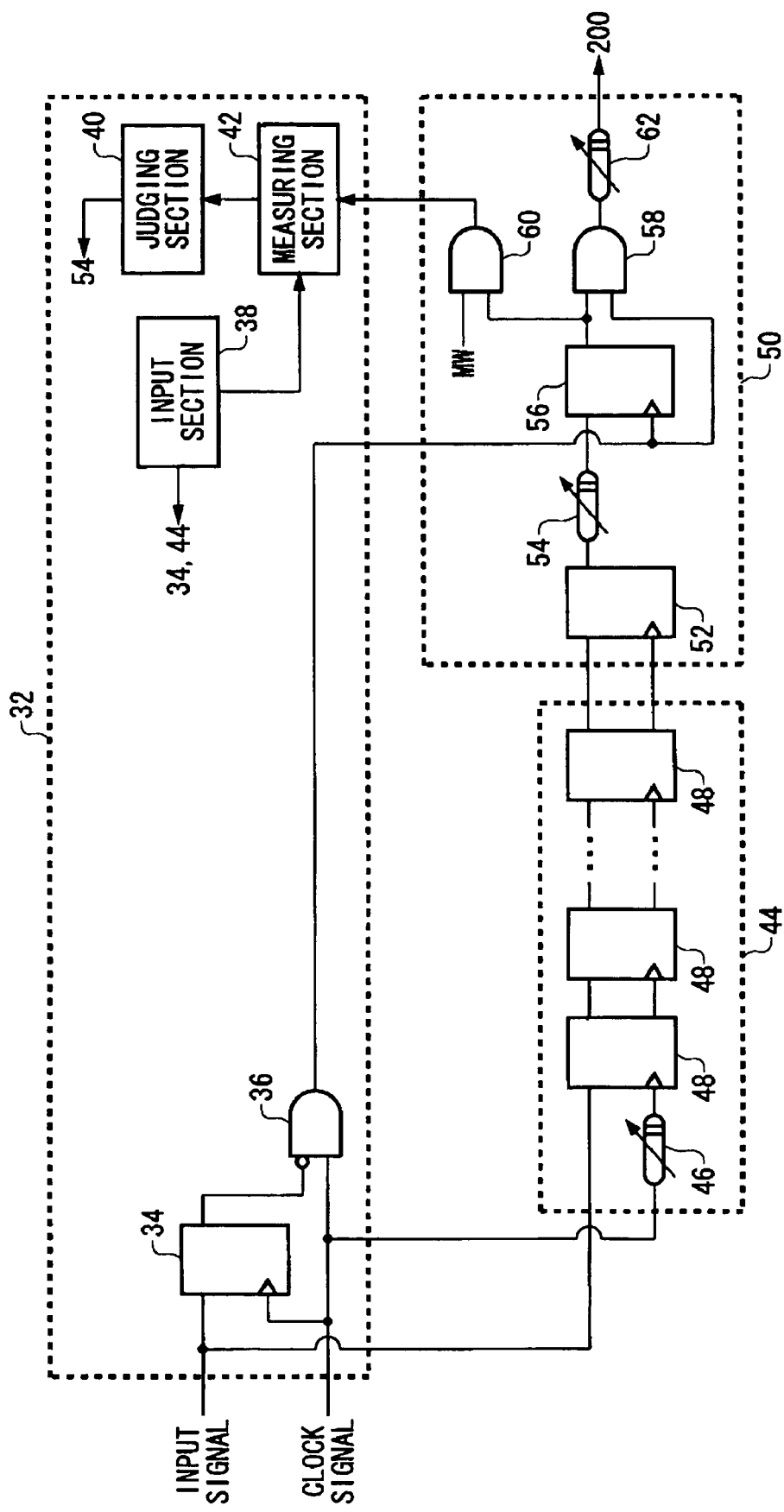
FIG. 2 shows an exemplary configuration of a signal output circuit 30.
Figure 3:
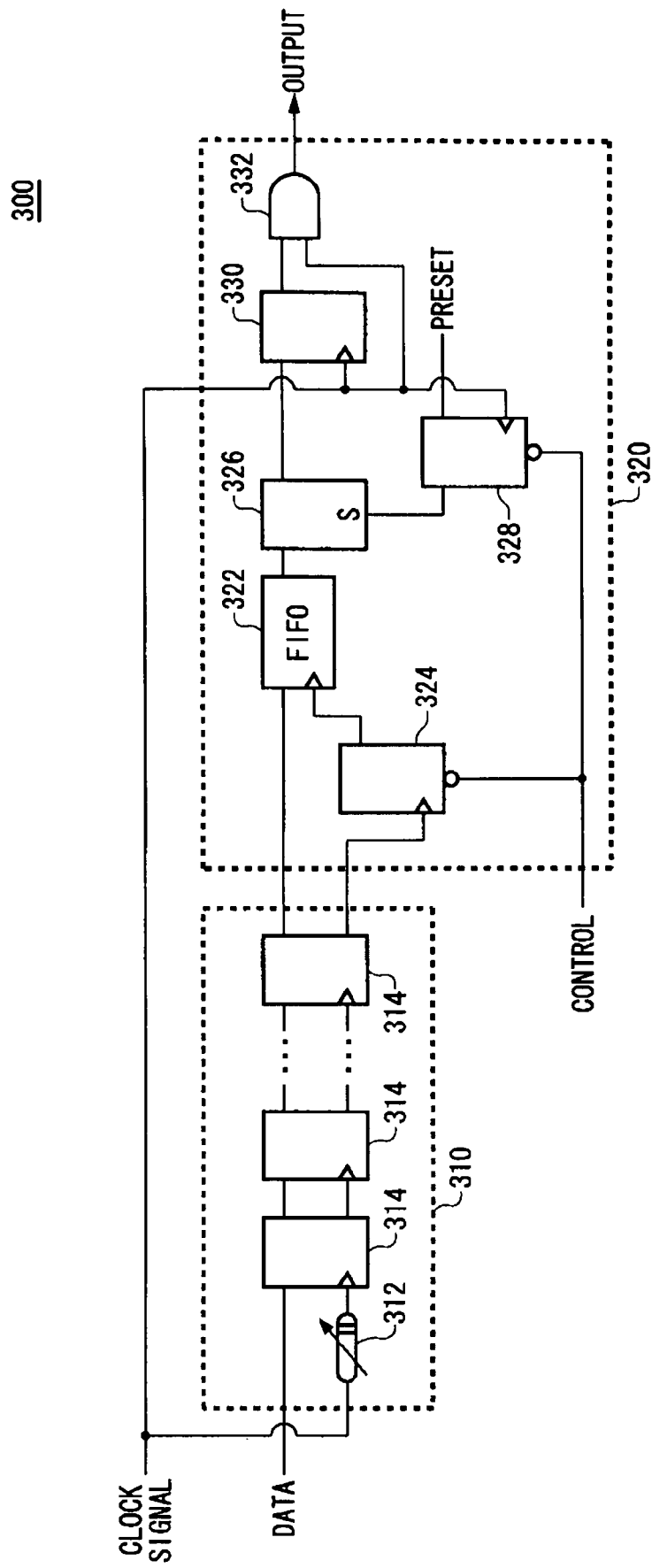
FIG. 3 shows a configuration of a typical signal output circuit 300.

FIG. 2 shows an exemplary configuration of each of the signal output circuits 30. The signal output circuit 30 includes a pattern generating section 44, a timing generating section 50, and an initializing section 32. The pattern generating section 44 outputs a data signal in accordance with a predetermined system timing. The timing generating section 50 outputs the data signal in response to a clock signal supplied thereto, in place of the clock signal supplied to the pattern generating section 44.

The pattern generating section 44 includes a delay element 46 and a shift register. The shift register may include, for example, a plurality of flip-flops 48 in a cascade arrangement. The flip-flops 48 receive an input signal, delay the input signal by a delay amount determined in accordance with the system timing, and output the delayed signal.

The pattern generating section 44 may further include a selecting section. The selecting section selects one of the pieces of data output from the flip-flops 48 in accordance with the predetermined system timing, and inputs the selected piece of data into the timing generating section 50.

The timing generating section 50 includes a flip-flop 52, a skew adjuster 54, a flip-flop 56, logical AND circuits 58 and 60, and a variable delay circuit 62.

The flip-flop 52 receives the data signal output from the pattern generating section 44 in response to the clock signal supplied to the pattern generating section 44, and outputs the data signal. The flip-flop 56 receives the data signal output from the flip-flop 52 via the skew adjuster 54 in response to the clock signal supplied to the timing generating section 50, and outputs the received data signal. Here, it should be noted that the clock signals supplied to the pattern generating section 44 and timing generating section 50 have substantially the same average cycle. According to this embodiment, these clock signals are generated by branching one signal into two signals, which are then supplied to the pattern generating section 44 and timing generating section 50.

The skew adjuster 54 is a variable delay circuit, for example. The skew adjuster 54 delays the data signal output from the flip-flop 52 and inputs the delayed data signal into the flip-flop 56. Varying the delay amount achieved by the skew adjuster 54 prevents meta-stable from occurring in the flip-flop 56.

The logical AND circuit 58 outputs a logical AND between the data output from the flip-flop 56 and the clock signal supplied to the timing generating section 50. This configuration enables a signal corresponding to the input signal to be output based on the system timing.

The variable delay circuit 62 delays the signal output from the logical AND circuit 58, and outputs the delayed signal. In other words, the variable delay circuit 62 controls the phase of the signal based on the system timing. The variable delay circuit 62 may include a shift register for delaying the signal by a delay amount equal to an integer multiple of the clock signal cycle, and a delay element for delaying the signal by a delay amount equal to or smaller than the clock signal cycle.

The initializing section 32 measures the delay amount at the plurality of flip-flops 48 to judge whether the delay amount achieved by the flip-flops 48 is in accordance with the system timing. The initializing section 32 may control the delay amount achieved by the skew adjuster 54 based on the judgment.

The initializing section 32 includes a counting section 34, a clock block section 36, an input section 38, a judging section 40, and a measuring section 42. The input section 38 inputs a predetermined reference signal into the counting section 34 and pattern generating section 44. In this embodiment of the invention, the input section 38 branches the single reference signal into two signals, and inputs the two signals into the counting section 34 and pattern generating section 44.

The counting section 34 counts the number of pulses of the clock signal by using the reference signal as a trigger. When the value indicating the result of the counting reaches a value determined in accordance with the system timing, the counting section 34 causes the input of the clock signal into the flip-flop 56 to be suspended. For example, the counting section 34 may cause the input of the clock signal to be suspended when the number of pulses counted reaches a value set in accordance with the number of stages of flip-flops 48 and flip-flop 52 through which the reference signal is transmitted.

The clock block section 36 inputs, into the flip-flop 56, a logical AND between the signal output from the counting section 34 and the clock signal. In this embodiment, the counting section 34 outputs a logical value of "1" when the value indicating the result of the counting reaches the value set in accordance with the system timing. The clock block section 36 outputs a logical AND between an inversion signal of the signal output from the counting section 34 and the clock signal. With the above configuration, the input of the clock signal into the flip-flop 56 can be suspended in accordance with the system timing.

The measuring section 42 receives the signal output from the flip-flop 56 via the logical AND circuit 60. When initialization is performed, the logical AND circuit 60 causes the signal output from the flip-flop 56 to pass therethrough to be transmitted to the measuring section 42. The measuring section 42 measures the signal that is output from the flip-flop 56 in the case where the counting section 34 causes the input of the clock signal into the flip-flop 56 to be suspended.

The judging section 40 judges whether the signal measured by the measuring section 42 corresponds to the reference signal. To be specific, if the delay amount achieved by the plurality of flip-flops 48 is in accordance with the system timing, the flip-flop 56, to which the clock signal is suspended from being input, has received the signal corresponding to the reference signal. Conversely, if the delay amount achieved by the plurality of flip-flops 48 is not in accordance with the system timing, the flip-flop 56, to which the clock signal is suspended from being input, has not received the signal corresponding to the reference signal.

Based on the judgment, the judging section 40 may adjust the delay amount achieved by the skew adjuster 54. Examples of this initialization process are described in the following. The judging section 40 may sequentially vary the delay amount of the skew adjuster 54 until the flip-flop 56 finally becomes able to receive the signal corresponding to the reference signal. Alternatively, the judging section 40 may detect the range for the delay amount of the skew adjuster 54 which allows the flip-flop 56 to receive the signal corresponding to the reference signal, and set the delay amount of the skew adjuster 54 at a value equal to the middle point of the range.

Having the above-described configuration, the signal output circuit 30 can output the data signal in response to the clock signal supplied to the timing generating section 50, in place of the clock signal supplied to the pattern generating section 44, without causing meta-stable, even when the delay amount achieved by the pattern generating section 44 is determined in accordance with the system timing. Also, the timing generating section 50 can output the signal in accordance with the system timing.

The signal output circuit 30 relating to the embodiment of the invention does not include sections such as a write counter and a read counter, thereby realizing a smaller circuit size.

Each time the system timing is varied, the initializing section 32 may measure the delay amount achieved by the pattern generating section 44, judge whether the measured delay amount is determined in accordance with the system timing, and adjust the delay amount achieved by the skew adjuster 54.

While the embodiment of the present invention has been described, the technical scope of the invention is not limited to the above described embodiment. It is apparent to persons skilled in the art that various alternations and improvements can be added to the above-described embodiment. It is also apparent from the scope of the claims that the embodiments added with such alternations or improvements can be included in the technical scope of the invention.

As clearly indicated by the above description, some aspects of the present invention can realize a signal output circuit which outputs a signal in accordance with a system timing and reduce occurrence of meta-stable attributable to the use of different clock signals between a pattern generating section and a timing generating section.

What is claimed is:

1. A signal output circuit for outputting an output signal in accordance with a predetermined system timing, the signal output circuit comprising:
    a shift register that receives an input signal and delays the input signal in accordance with the system timing;
    a flip-flop that receives the input signal delayed by the shift register in response to a clock signal supplied thereto, and outputs the input signal as the output signal; and
    an initializing section that measures a delay amount achieved by the shift register and judges whether the measured delay amount is in accordance with the system timing,
    the initializing section including:
    an input section that inputs a reference signal into the shift register;
    a counting section that counts the number of pulses of the clock signal by using the reference signal as a trigger, and causes inputting of the clock signal into the flip-flop to be suspended when a value indicating a result of the counting reaches a value set in accordance with the system timing;
    a measuring section that measures a signal output from the flip-flop in a case where the inputting of the clock signal is suspended; and
    a judging section that judges whether the signal measured by the measuring section corresponds to the reference signal.

2. The signal output circuit according to claim 1, further comprising
    a skew adjuster that delays the input signal output from the shift register and inputs the delayed input signal into the flip-flop, wherein
    the initializing section adjusts a delay amount achieved by the skew adjuster based on the judgment made by the judging section.

3. The signal output circuit according to claim 2, wherein each time the system timing is varied, the initializing section measures the delay amount achieved by the shift register, judges whether the measured delay amount is in accordance with the system timing, and adjusts the delay amount achieved by the skew adjuster.

4. A test apparatus for testing a device under test, comprising:
    a signal output circuit that supplies a predetermined signal to the device in accordance with a predetermined system timing; and a quality judging section that judges whether the device is good or bad based on a signal output from the device, the signal output circuit including:

a shift register that receives an input signal and delays the input signal in accordance with the system timing;

a flip-flop that receives the input signal delayed by the shift register in response to a clock signal supplied thereto, and outputs the input signal as the predetermined signal; and an initializing section that measures a delay amount achieved by the shift register and judges whether the measured delay amount is in accordance with the system timing, the initializing section including:

an input section that inputs a reference signal into the shift register;

a counting section that counts the number of pulses of the clock signal by using the reference signal as a trigger, and causes inputting of the clock signal into the flip-flop to be suspended when a value indicating a result of the counting reaches a value set in accordance with the system timing;

a measuring section that measures a signal output from the flip-flop in a case where the inputting of the clock signal is suspended; and a judging section that judges whether the signal measured by the measuring section corresponds to the reference signal.

* * * * *